United States Patent
Zeng et al.

(10) Patent No.: US 10,499,504 B2
(45) Date of Patent: Dec. 3, 2019

(54) APPARATUS COMPRISING CONDUCTIVE PORTIONS AND A METHOD OF MAKING THE APPARATUS

(75) Inventors: Sen Zeng, Beijing (CN); Ligang Shang, Beijing (CN); Song Wang, Beijing (CN)

(73) Assignee: Nokia Technologies Oy, Espoo (FI)

(*) Notice: Subject to any disclaimer, the term of this patent is extended or adjusted under 35 U.S.C. 154(b) by 837 days.

(21) Appl. No.: 14/405,346

(22) PCT Filed: Jun. 4, 2012

(86) PCT No.: PCT/CN2012/076426
§ 371 (c)(1),
(2), (4) Date: Dec. 3, 2014

(87) PCT Pub. No.: WO2013/181781
PCT Pub. Date: Dec. 12, 2013

(65) Prior Publication Data
US 2015/0173187 A1    Jun. 18, 2015

(51) Int. Cl.
*G06F 3/044* (2006.01)
*H05K 1/09* (2006.01)
(Continued)

(52) U.S. Cl.
CPC ............ *H05K 1/09* (2013.01); *C23C 18/1633* (2013.01); *G06F 3/044* (2013.01); *H05K 1/03* (2013.01);
(Continued)

(58) Field of Classification Search
CPC .......... H05K 1/03; H05K 1/09; H05K 3/0091; C23C 18/1633; G06F 3/044;
(Continued)

(56) References Cited

U.S. PATENT DOCUMENTS 5,260,180 A * 11/1993 Sahyun .................. G03C 1/498
430/495.1
5,766,828 A * 6/1998 Patel .................... G03C 1/4989
430/350
(Continued)

FOREIGN PATENT DOCUMENTS

EP    2 333 645 A1    6/2011
EP    2 354 185 A1    8/2011
(Continued)

OTHER PUBLICATIONS

World's first 3D touch panel product [online] [retrieved Mar. 28, 2012]. Retrieved from the Internet: URL://www.printedelectronicsworld.com/articles/worlds-first-3d-touch-panel-product-00003988.asp?sessi . . . (dated Dec. 8, 2011) 1 page.
(Continued)

*Primary Examiner* — Brian K Talbot
(74) *Attorney, Agent, or Firm* — Alston & Bird LLP

(57) ABSTRACT

A method comprising: creating, first conductive traces (12) over a substrate (10) by selective creation of metallization over the substrate (10) using selective direct structuring of a material configured for selective direct structuring; and creating second conductive areas (16A, 16B) over the substrate (10) directly in contact with at least darts of the first conductive traces (12).

17 Claims, 3 Drawing Sheets

(51) Int. Cl.
*C23C 18/16* (2006.01)
*H05K 1/03* (2006.01)
*H05K 3/00* (2006.01)
*B05D 5/12* (2006.01)
*B05D 3/06* (2006.01)
*B05D 7/00* (2006.01)

(52) U.S. Cl.
CPC ........... *H05K 3/0091* (2013.01); *B05D 3/062* (2013.01); *B05D 5/12* (2013.01); *B05D 7/50* (2013.01); *G06F 2203/04103* (2013.01)

(58) Field of Classification Search
CPC . G06F 2203/04103; B05D 3/062; B05D 5/12; B05D 7/50
USPC .......................................... 427/58, 554, 555
See application file for complete search history.

(56) References Cited

U.S. PATENT DOCUMENTS

| | | | |
|---|---|---|---|
| 7,183,603 | B2 | 2/2007 | Park |
| 2009/0267220 | A1* | 10/2009 | Kuhlman ............ H01L 23/3121 257/698 |
| 2009/0292048 | A1 | 11/2009 | Li et al. |
| 2009/0292051 | A1* | 11/2009 | Li ........................ C08K 3/0008 524/404 |
| 2010/0090981 | A1 | 4/2010 | Park et al. |
| 2010/0103138 | A1 | 4/2010 | Huang et al. |
| 2010/0164901 | A1 | 7/2010 | Chen et al. |
| 2010/0263919 | A1 | 10/2010 | Lee et al. |
| 2012/0052929 | A1 | 3/2012 | Thammasouk et al. |
| 2012/0134631 | A1 | 5/2012 | Chiang et al. |
| 2014/0255600 | A1* | 9/2014 | Bastenbeck ......... C23C 18/1607 427/123 |

FOREIGN PATENT DOCUMENTS

| | | |
|---|---|---|
| EP | 2 354 900 A2 | 8/2011 |
| EP | 2 390 771 A2 | 11/2011 |
| WO | WO 2009/137290 A2 | 11/2009 |

OTHER PUBLICATIONS

International Search Report/Written Opinion for PCT/CN2012/076426 dated Mar. 14, 2013.
Extended European Search Report for corresponding European Application No. 12878354.5 dated Oct. 29, 2015, 9 pages.
Office Action for European Application No. 12 878 354.5 dated Nov. 25, 2016.
Summons to Attend Oral Proceedings for European Application No. 12 878 354.5 dated Mar. 8, 2018, 11 pages.

* cited by examiner

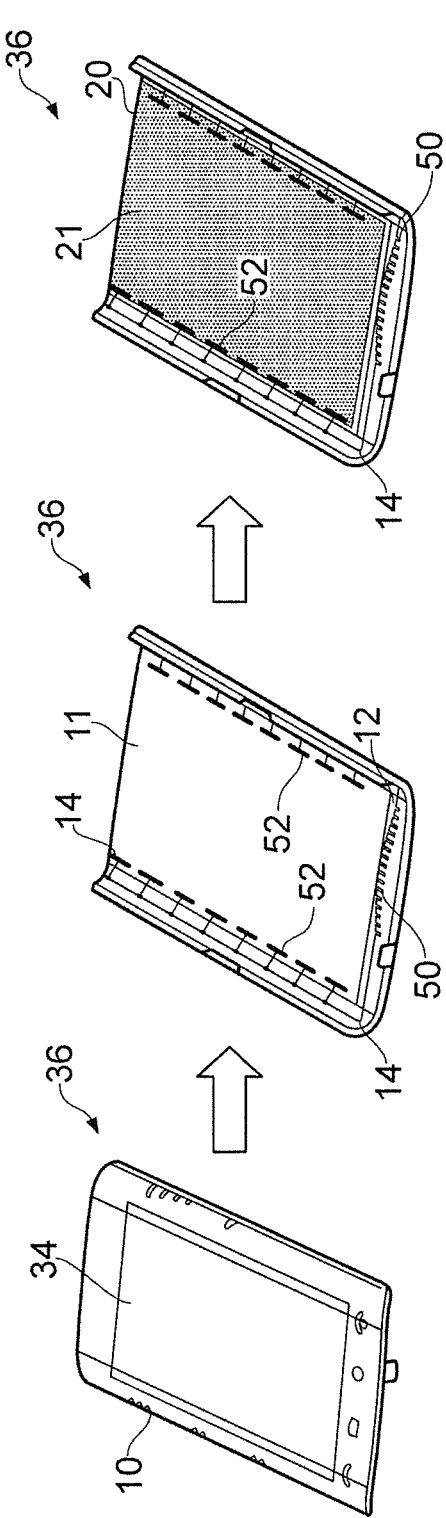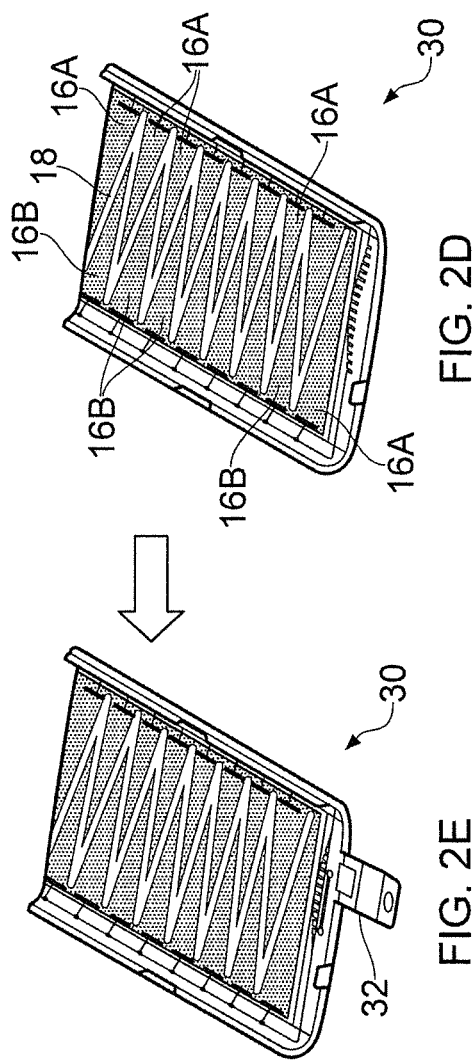

APPARATUS COMPRISING CONDUCTIVE PORTIONS AND A METHOD OF MAKING THE APPARATUS

TECHNOLOGICAL FIELD

Embodiments of the present invention relate to an apparatus comprising conductive portions and a method of making the apparatus.

BACKGROUND

It is desirable to create products that have conductors.

BRIEF SUMMARY

According to various, but not necessarily all, embodiments of the invention there is provided a method comprising: creating first conductive traces over a substrate by selective creation of metallization over the substrate using selective direct structuring of a material configured for selective direct structuring; and creating second conductive areas over the substrate directly in contact with at least parts of the first conductive traces.

According to various, but not necessarily all, embodiments of the invention there is provided an apparatus comprising: a substrate; material configured to respond to irradiation to convert to a irradiated state in which it functions, where it has been irradiated, as a substrate for metallization; first conductive traces formed by metallization over portions of the material; and second conductive areas formed over the substrate and directly in contact with at least parts of the first conductive traces.

BRIEF DESCRIPTION

For a better understanding of various examples of embodiments of the present invention reference will now be made by way of example only to the accompanying drawings in which:

FIGS. 2A to 2E illustrate an example of a method for manufacturing an apparatus;

DETAILED DESCRIPTION

FIGS. 1A to 1G illustrate a method comprising: creating first conductive traces 14 over a substrate by selective creation of metallization 12 over the substrate using selective direct structuring of a material 2 configured for selective direct structuring; and creating second conductive areas 16A, 16B over the substrate 10 directly in contact with at least parts of the first conductive traces 14.

Figure 1A:
FIGS. 1A to 1G illustrate an example of a method for manufacturing an apparatus.

At FIG. 1A, a substrate 10 is provided. The substrate 10 may, for example, be a plastics substrate. It may for example be an injection-molded plastics substrate. Alternatively, it may be a metal substrate or a glass substrate or a ceramic substrate. The substrate 10 may be planar or three dimensional. It may have a non-planar surface.

Figure 1B:
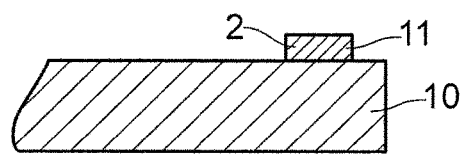

At FIG. 1B, a first layer 11 of material 2 is deposited on the substrate 10. The deposited first layer 11 of material 2 is configured for selective direct structuring on the substrate 10. In alternative embodiments, the substrate 10 may itself be formed from a material 2 configured for selective direct structuring and, in this case, the additional deposition of the first layer 11 of material 2 is not required as a first layer 11 of material 2 is already integrated into a surface of the substrate 10.

Selective direct structuring, involves the selective conversion of the material 2 from a first state in which it is not a suitable substrate for metallization to a second state in which the material 2 is a suitable for metallization. The change in state may be achieved, for example, by irradiation. Laser direct structuring uses a laser as the irradiation source.

In this example, selective direct structuring of the material, as described below comprises selective irradiation of a first upper surface portion of the material 2 to convert the first upper surface portion of the material from a first state to a second state in which the material is a substrate for metallization, followed by selective metallization on the first upper surface portion of the first layer 11 of material 2 that is in the second state. The selective metallization creates first conductive traces 12 over the substrate 10.

The deposition of the first layer 11 may be by accretion, that is the first layer 11 is built-up (grown) gradually by gradual external addition of its component parts. The first layer 11 is therefore an accumulation of the separately provided component parts. The material 2 may be deposited, in some but not necessarily all embodiments, by spraying the material 2 in liquid form onto the substrate 10. The droplets of liquid (component parts) solidify on the substrate to form the deposited first layer 11.

The deposited first layer 11 of material 2 may be thin, for example, it may have a thickness of between 1 μm and 0.1 mm.

Figure 1C:
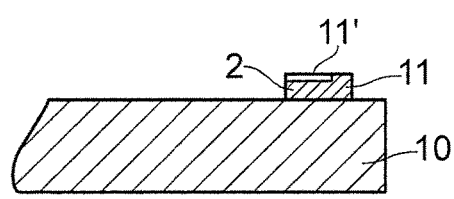

At FIG. 1C, a first upper surface portion 11' of the first layer 11 of material 2 is selectively irradiated to convert the first upper surface portion 11' of the first layer 11 of material 2 from a first state in which the material 2 is, for example, a dielectric to a second state in which the material 2 is a substrate for metallization.

The mechanism used for selective irradiation may vary. In one implementation the material 2 is selectively irradiated by scanning a laser over the material 2. In some, but not necessarily all implementations, laser ablation may convert the material 2 from the first state to the second state.

The selective irradiation of the first upper surface portion 11' of the first layer 11 of material 2 to convert the first upper surface portion 11' of the first layer 11 of material 2 to a second state in which the material 2 is a substrate for metallization uses a laser at a power and duration sufficient to convert the first upper surface portion 11' of the first layer 11 of material 2 to the second state in which the material 2 is a substrate for metallization but of insufficient power and duration to penetrate the first layer 11 of material.

Figure 1D:
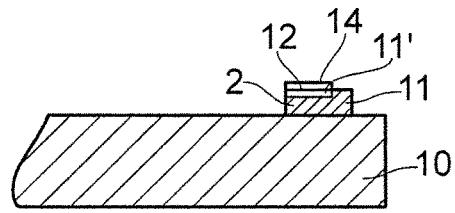

At FIG. 1D, selective metallization 12 is provided on the first upper surface portion 11' of the first layer 11 of material 2 that is in the second state after selective irradiation. The metallization 12 is selective in that it does not occur or does not occur significantly on the first layer 11 of material 2 that remains in the first state because it has not been irradiated.

Ultrasonic cleaning may occur before metallization.

The metallization 12 may comprise electroless plating. In electroless plating metal ions in solution are reduced to form metal atoms. The electroless plating may be followed by electrolytic plating using the electroless metal plating as a cathode.

The selective metallization 12 creates first conductive traces 14 over the substrate 10.

Figure 1E:
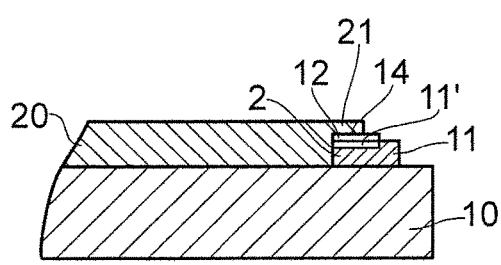
Figure 1F:
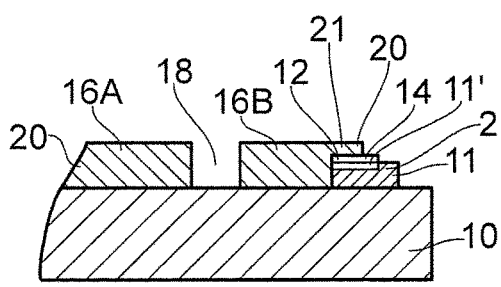

Next, as illustrated in FIGS. 1E and 1F, second conductive areas 16A, 16B are created over the substrate 10 directly in contact with at least parts of the first conductive traces 14.

At FIG. 1E, a second layer 21 of conductive material 20 is deposited over at least a portion of the metallization 12 which is on the first upper surface portion 11' of the first layer 11 of material 2

The conductive material 20 may be, for example, indium tin oxide (ITO). The indium tin oxide may have been applied, for example, using magnetron sputtering or heat transfer printing. The indium tin oxide may be transparent.

In the illustrated example the second layer 21 of conductive material 20 contacts directly the metallization 12 on the first upper surface portion 11' of the first layer 11 of material and also contacts directly the first layer 11 of material 2 that remains in the first state and has not received any metallization 12.

At FIG. 1F, the second layer 21 of conductive material 20 is patterned. The second layer 21 of conductive material 2 is selectively removed to create vias 18 through the conductive material 2 at least to the first layer 11 of material 2. The vias 18 create separated second conductive areas 16A, 16B which are separated by a non-conductive gap provided by a via 18.

The patterning of the second layer 21 of conductive material 20 may be achieved using a laser, for example, to ablate the conductive material 20.

The patterning of the second layer 21 of conductive material 20 may, for example, use an ultraviolet (e.g. 350 nm) laser.

The laser may be used at a power and duration sufficient to completely remove the second layer 21 of conductive material 20 but of insufficient power and duration to remove the first layer 11 of material.

The patterning of the second layer 21 of conductive material 20 creates an apparatus 30.

The apparatus 30 comprises: a substrate 10; a material 2 configured to respond to irradiation to convert to a irradiated state in which it functions, where it has been irradiated, as a substrate for metallization; first conductive traces 12 formed by metallization over portions of the material 2; and patterned second conductive areas 16A, 16B formed over the substrate 10 and directly in contact with at least parts of the first conductive traces 12.

The selective irradiation of the first layer 11 of the material 2 enables selective metallization 12 while retaining a lower portion of the first layer 11 of the material 2 as a dielectric layer that physically separates the metallization 12 from the substrate 10. The first layer 11 of the material 2 physically separates the metallization 12 from the substrate 10 and separates the second conductive areas 16A, 16B from the substrate 10.

In some embodiments, the first conductive traces 14 may be connected to the conductive areas 16A, 16B to define electric circuits for sensing changes in capacitance between the conductive areas 16A, 16B. This enables the apparatus 30 to be used as a capacitive touch sensor.

Figure 1G:
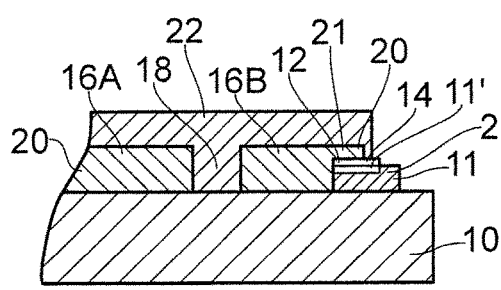

At FIG. 1G, a protective layer 22 is deposited over the upper surface of the apparatus 30. The protective layer covers the via 18 and the patterned second layer 21.

The protective layer 22 protects the second layer 21 from abrasion.

The protective layer 22 may also fill vias 18 and forms a capacitor dielectric positioned between plates of a capacitor defined by the separated second conductive areas 16A, 16B.

The protective layer 22, if present, may, for example, be formed from an oxide such as, for example, silicon dioxide.

Various different compositions may be used for material 2.

For example, the material 2 may comprise a reducing agent dispersed in a dielectric medium that provides for metallization in the second state. The reducing agent may be exposed in the second state following the selective irradiation. When metallization occurs, the exposed reducing agent may preferentially accelerate reduction of metal ions to form elemental metal. The dielectric medium may, for example, be a polymer or plastics. The material 2 may be deposited as a spray, for example, of liquid droplets.

For example, the material 2 may comprise metal oxide dispersed in a dielectric medium. The dielectric medium enables the material 2 to operate as a dielectric in the first state before irradiation. The metal oxide enables the material 2 to act as a substrate for metallization in the second state after irradiation. The metal oxide may for example be a transition metal oxide. The metal oxide may for example be a multi-metal oxide, that is, an oxide that includes at least two different metals. The two different metals may be transition metals. The dielectric medium may, for example, be a polymer or plastics. The material 2 may be deposited as a spray, for example, of liquid droplets.

For example, the material 2 may comprise an accelerator (catalyst) dispersed in a dielectric medium that provides for metallization in the second state. The dielectric medium may, for example, be a polymer or plastics. The material 2 may be deposited as a spray, for example, of liquid droplets One example of a suitable accelerator is $AM_xB_yO_z$ where A is one or more elements selected from Groups 10 and 11 of the Periodic Table, M is one or more metal elements in oxidation state 3+ selected from the group consisting of Fe, Co, Mn, Al, Ga, In, Ti and rare earth elements, O is oxygen, B is boron, x=0 to 2, y=0.01 to 2 and z=1 to 4.

Another suitable accelerator is $A'M'_mB_yO_n$ where A' is one or more elements selected from Groups 9, 10 or 11 of the Periodic Table, M' is one or more metal elements selected from the group consisting of Cr, Mo, W, Se, Te and Po, O is oxygen, m=0.01 to 2 and n=2 to 4.

For example, the material 2 may comprise spinel-structure oxides ($CuCr_2O_4$)) dispersed in a dielectric medium that provides for metallization in the second state. The dielectric medium may, for example, be a polymer or plastics. The material 2 may be deposited as a spray, for example, of liquid droplets.

For example, the material 2 may comprise a heavy metal mixture oxide spinel, or a copper salt such as, for example, copper chromium oxide spinel.

The dielectric medium may, for example, be a polymer or plastics. The material 2 may be deposited as a spray, for example, of liquid droplets.

FIGS. 2A-2E illustrate an example of how the method used in FIGS. 1A to 1G may be used to create a cover housing 36 for an electronic device. In this example, the cover housing 36 comprises a display window 34 and the method provides the elements that enable the display window 34 to operate as a touch sensitive input device that is positioned over the display of the electronic device in use.

The electronic device may, for example, be a hand-portable electronic device that is sized to fit on the palm of a human hand on in an inside jacket pocket.

The electronic device may, for example, be a personal electronic device. It may, for example, be a mobile cellular telephone, a media player, a camera, a controller, a personal digital assistant, a tablet personal computer etc.

FIG. 2A illustrates the housing cover 36 comprising the display window 34. The housing cover may be, for example, formed from injection molded plastics. It is three-dimensional and comprises a substantially planar front face and a plurality of sidewalls that curve to meet the front face.

FIG. 2B illustrates the housing cover 36 after processing as previously described with reference to FIGS. 1A to 1D to form first conductive traces 14 over the substrate 10. In this example, each of N separate single first conductive traces 14 extend from an external interface region 50 to one of the N respective internal interface regions 52 without overlapping.

FIG. 2C illustrates the housing cover 36 after processing as previously described with reference to FIG. 1E. The deposited second layer 21 of conductive material is deposited over the N internal interface regions 52 but not over the N external interface regions 50.

FIG. 2D illustrates the housing cover 36 after processing as previously described with reference to FIG. 1F. The deposited second layer 21 of conductive material 20 has been patterned. The second layer 21 of conductive material 20 is selectively removed to create vias 18 through the conductive material 20 at least to the first layer 11 of material 2. The vias 18 create separated second conductive areas 16A, 16B which are separated by a non-conductive gaps provided by vias 18.

FIG. 2E illustrates the housing cover 36 after processing as previously described with reference to FIG. 1G. A connector 32, for example a flexible circuit board has additionally been connected to the external interface 50.

The resultant apparatus 30 is a housing module for an electronic device.

The second conductive areas 16A, 16B operate as capacitor plates. Each of the first conductive traces 14 connects a capacitor plate 16 via the internal interface 52 of a first conductive trace, the first conductive trace 14 and the external interface 50 to the connector 32. When a user touches the exterior display window 34, there is a change in capacitance between particular pairs of second conductive areas 16A, 16B. By determining which pairs of second conductive areas 16A, 16B experience the greatest change in capacitance the position of the touch can be determined.

The method illustrated in FIGS. 1A to 1G and also the method illustrated in FIGS. 2A to 2D results in, as a direct product, an apparatus 30 comprising: a substrate 10; a material 2 configured to respond to irradiation to convert to a irradiated state in which it functions, where it has been irradiated, as a substrate for metallization; first conductive traces 12 formed by metallization over portions of the material 2; and patterned second conductive areas 16A, 16B formed over the substrate 10 and directly in contact with at least parts of the first conductive traces 12.

The first layer 11 of material 2 may be thin, for example, it may have a thickness of between 1 μm and 0.1 mm.

The second layer 21 of material 2 may be thin, for example, it may have a thickness material 2 has a thickness of between 1 μm and 0.1 mm.

Figure 3:
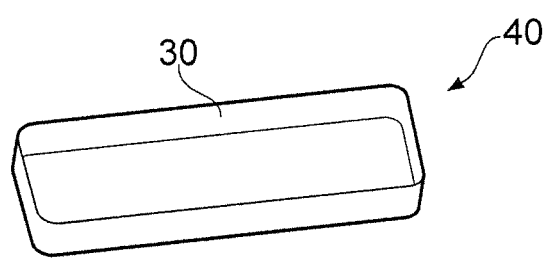
FIG. 3 illustrates an example of an apparatus.

The apparatus 30 may be a three-dimensional structure. As illustrated in FIG. 3, the apparatus 30 may be integrated within a module 40 for an electronic device. The module 40 may, for example, be a housing, a cover, a structural element, or part or the whole of an input device such as for example a capacitance sensor or a capacitive touch input device.

As used here 'module' refers to a unit or apparatus that excludes certain parts/components that would be added by an end manufacturer or a user.

Although embodiments of the present invention have been described in the preceding paragraphs with reference to various examples, it should be appreciated that modifications to the examples given can be made without departing from the scope of the invention as claimed.

For example, instead of using selective direct structuring to create the first conductive traces, an alternative technique may be used, for example, printing. Thus the method may comprise: creating first conductive traces 14 over a substrate by selective creation of metallization 12 over the substrate; and creating second conductive areas 16A, 16B over the substrate 10 directly in contact with at least parts of the first conductive traces 14.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

What is claimed is:

1. A method, for manufacturing a capacitive touch sensor, comprising:
creating first conductive traces over a substrate by selective creation of metallization over the substrate using selective direct structuring of a material configured for selective direct structuring; and
creating second conductive areas over the substrate directly in contact with at least parts of the first conductive traces.

2. A method as claimed in claim 1, further comprising: depositing on the substrate a first layer of the material configured for selective direct structuring.

3. A method as claimed in claim 1, comprising selective direct structuring of the material comprising:
selective irradiation of a first upper surface portion of the material to convert the first upper surface portion of the material from a first state to a second state in which the material is a substrate for metallization;
selective metallization on the first upper surface portion of a first layer of material that is in the second state.

4. A method as claimed in claim 3, wherein irradiation of a first upper surface portion of the first layer of material to convert the first upper surface portion of the first layer of material to a second state in which the material is a substrate for metallization uses a laser at a power and duration sufficient to convert the first upper surface portion of the first layer of material to the second state in which the material is a substrate for metallization but of insufficient power and duration to penetrate the first layer of material.

5. A method as claimed in claim 3, wherein ablation converts the material from the first state to the second state.

6. A method as claimed in claim 3, wherein metallization comprises electroless plating.

7. A method as claimed in claim 1,
wherein the material comprises a reducing agent dispersed in a dielectric medium that provides for metallization in a second state.

8. A method as claimed in claim 1, wherein the material comprises metal oxide dispersed in a dielectric medium that provides for metallization in a second state.

9. A method as claimed in claim 1, wherein the material comprises transition metal oxide dispersed in a dielectric medium that provides for metallization in a second state.

10. A method as claimed in claim 1, wherein the material comprises multi-metal oxide dispersed in a dielectric medium that provides for metallization in a second state, wherein the multi-metals of the multi-metal oxide are transition metals.

11. A method as claimed in claim 1, wherein the material comprises an accelerator dispersed in a dielectric medium that provides for metallization in a second state.

12. A method as claimed in claim 11,
wherein the accelerator is $AM_xB_yO_z$ A is one or more elements selected from Groups 10 and 11 of the Periodic Table, M is one or more metal elements in oxidation state 3+ selected from the group consisting of Fe, Co, Mn, Al, Ga, In, Ti and rare earth elements, O is oxygen, B is boron, x=0 to 2, y=0.01 to 2 and z=1 to 4;
or
wherein the accelerator is $A'M'_mB_yO_n$
and wherein A' is one or more elements selected from Groups 9, 10 or 11 of the Periodic Table, M' is one or more metal elements selected from the group consisting of Cr, Mo, W, Se, Te and Po, O is oxygen, m=0.01 to 2 and n=2 to 4.

13. A method as claimed in claim 12, wherein the accelerator $A'M'_mB_yO_n$ is a spinel-structure oxide.

14. A method as claimed in claim 1, wherein the substrate is a three-dimensional injection-molded plastics substrate configured as a cover for a hand-portable electronic device.

15. A method as claimed in claim 1, further comprising as an additional step manufacturing as a direct product a module for an electronic device that comprises:
a supporting substrate;
a dielectric configured to respond to irradiation to convert to a irradiated state in which it functions, where it has been irradiated, as a substrate for metallization;
first conductive traces formed over portions of the dielectric that have been subject to laser direct structuring; and
patterned second conductive areas formed over the substrate and directly in contact with at least parts of the first conductive traces.

16. A method as claimed in claim 1, further comprising connecting the conductive areas to the first conductive traces for sensing changes in capacitance between the conductive areas for capacitive touch detection.

17. A method as claimed in claim 1, wherein the first conductive traces are created over portions of the substrate.

* * * * *